United States Patent [19]

Imai et al.

[11] Patent Number: 4,937,313
[45] Date of Patent: Jun. 26, 1990

[54] METHOD FOR MANUFACTURING POLYAMIDE RESIN FROM ONSATURATED BIS-AMIDE AND ARYLENE DIHALIDE

[75] Inventors: Yoshio Imai, Tokyo; Masa-aki Kakimoto, Yokohama; Masaru Yoneyama; Masanori Tanaka, both of Tokyo, all of Japan

[73] Assignee: Tosoh Corporation, Shinnanyo, Japan

[21] Appl. No.: 369,195

[22] Filed: Jun. 21, 1989

[30] Foreign Application Priority Data

Jun. 22, 1988 [JP] Japan .................................. 63-152243

[51] Int. Cl.$^5$ ............................................. C08G 69/00
[52] U.S. Cl. ................................. 528/271; 528/345; 528/392; 528/397
[58] Field of Search ................ 528/271, 345, 392, 397

[56] References Cited

U.S. PATENT DOCUMENTS 4,297,475 10/1981 Nelson et al. ..................... 528/271
4,405,777  9/1983 Wu et al. ........................... 528/271
4,412,061 10/1983 Wu et al. ........................... 528/271

*Primary Examiner*—Harold D. Anderson
*Attorney, Agent, or Firm*—Oblon, Spivak, McClelland, Maier & Neustadt

[57] ABSTRACT

A polyamide resin having double bonds in its main chain and containing repeating units represented by the formula (I):

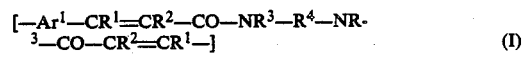

$$[-Ar^1-CR^1=CR^2-CO-NR^3-R^4-NR^3-CO-CR^2=CR^1-] \quad (I)$$

wherein $Ar^1$ is a bivalent aromatic radical, $R^1$, $R^2$ and $R^3$ each independently represent a hydrogen atom, a univalent aromatic or an aliphatic radical, and $R^4$ is a bivalent aromatic or aliphatic radical, said polyamide resin having a reduced viscosity ($\eta sp/c$) of 0.1–5.0 dl/g at a concentration of 0.5 g/dl in N,N-dimethylacetamide at 30° C. is prepared by reacting a bis-alkenoic amide of formula (II):

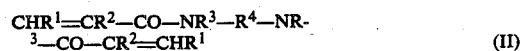

$$CHR^1=CR^2-CO-NR^3-R^4-NR^3-CO-CR^2=CHR^1 \quad (II)$$

wherein $R^1$, $R^2$, $R^3$ and $R^4$ are as defined above with an aromatic dihalide represented by formula (III):

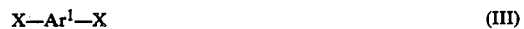

$$X-Ar^1-X \quad (III)$$

wherein $Ar^1$ is bivalent aromatic radical and X is a halogen atom, in the presence of a palladium catalyst and a base in an organic solvent.

9 Claims, No Drawings

METHOD FOR MANUFACTURING POLYAMIDE RESIN FROM ONSATURATED BIS-AMIDE AND ARYLENE DIHALIDE

BACKGROUND OF THE INVENTION

1. Field of the Invention

The present invention relates to a method for manufacturing a polyamide resin which contains double bonds in its main chain.

2. Description of the Background

Polyamide resins having double bonds in the main chain have been used as industrial materials because of their excellent photosensitivity. A method for manufacturing the resins have been known in which a diamine and an alkenoic dichloride are made to undergo polycondensation in an organic solvent.

The methods of the prior art involve problems such that the synthesis is extremely laborious because of the instability of the alkenoic dichloride and because of problems encountered in its handling. These problems result in difficulties and high costs in manufacturing polyamide resins having double bonds in the main chain. A need therefore continues to exist for an improved method of manufacturing unsaturated polyamide resins.

SUMMARY OF THE INVENTION

Accordingly, one object of the present invention is to provide a method of synthesizing a polyamide resin containing double bonds in the main chain by starting with materials that are stable, easy to handle and inexpensive.

Briefly, this object and other objects of the present invention as hereinafter will become more readily apparent can be attained in a method for manufacturing a polyamide resin having double bonds in its main chain and having repeating units represented by the formula (I):

$$[-Ar^1-CR^1=CR^2-CO-NR^3-R^4-NR^3-CO-CR^2=CR^1-] \quad (I)$$

wherein $Ar^1$ is a bivalent aromatic radical, $R^1$, $R^2$ and $R^3$ each independently represent a hydrogen atom, a univalent aromatic or an aliphatic radical, and $R^4$ is a bivalent aromatic or aliphatic radical, said polyamide resin having a reduced viscosity ($\eta sp/c$) of 0.1–5.0 dl/g at a concentration of 0.5 g/dl in N,N-dimethylacetamide at 30° C., comprising reacting a bisalkenoic amide of formula (II):

$$CHR^1=CR^2-CO-NR^3-R^4-NR^3-CO-CR^2=CHR^1 \quad (II)$$

wherein $R^1$, $R^2$, $R^3$ and $R^4$ are as defined above with an aromatic dihalide represented by formula (III):

$$X-Ar^1-X \quad (III)$$

wherein $Ar^1$ is a bivalent aromatic radical and X is a halogen atom, in the presence of a palladium catalyst and a base in an organic solvent.

DETAILED DESCRIPTION OF THE PREFERRED EMBODIMENTS

In the process of the present invention the bisalkenoic amide reactant represented by the formula (II) can be easily prepared by reacting 2 moles of alkenoic chloride and 1 mole of a diamine. In the formula, $R^1$, $R^2$ and $R^3$ each independently represent a hydrogen atom, an aryl radical such as phenyl, tolyl, anisyl or nitrophenyl, or an aliphatic radical such as $C_1$–$C_8$ alkyl. Alternatively, $R^1$ and $R^2$ and/or $R^1$ and $R^3$ may be linked together to form a ring structure.

$R^4$ is a bivalent aromatic radical shown below or a bivalent aliphatic radical such as $C_1$–$C_{15}$ bivalent alkyl. The aliphatic radical may be of a branched structure or of an alicyclic ring structure.

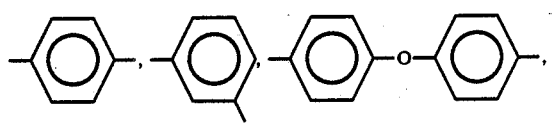

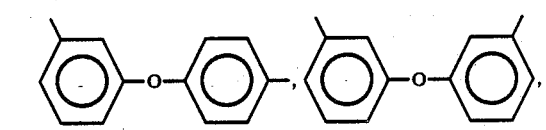

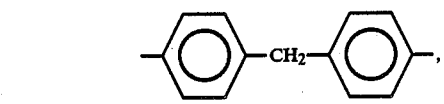

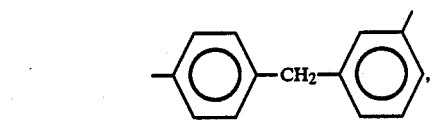

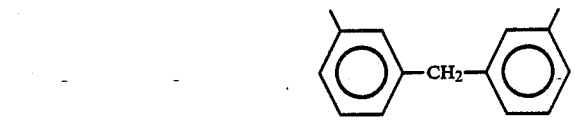

Suitable aromatic dihalides represented by formula (III) include m-dibromobenzene, p-dibromobenzene, 3,3'-dibromodiphenylmethane, 4,4'-dibromodiphenylmethane, 3,4'-dibromodiphenylmethane, 3,3'-dibromodiphenyl ether, 4,4'-dibromodiphenyl ether, 3,4'-dibromodiphenyl ether, 2,5-dibromothiophene, 2,5-bis(4-bromophenyl)-3,4-diphenylthiophene, m-diiodobenzene, p-diiodobenzene, 3,3'-diiododiphenylmethane, 4,4'-diiododiphenylmethane, 3,4'-diiododiphenylmethane, 3,3'-diiododiphenyl ether, 4,4'-diiododiphenyl ether, 3 4'-diiododiphenyl ether, 2,5-diiodothiophene, 2,5-bis(4-iodophenyl)-3,4-diphenylthiophene, and the like.

The base employed in the reaction includes inorganic bases such as sodium hydroxide, potassium hydroxide, sodium carbonate, potassium carbonate, sodium hydrogencarbonate, potassium hydrogencarbonate, sodium acetate, and potassium acetate, and organic bases such as tributylamine, 4-dimethylaminopyridine, 1,8-diazabicyclo[5,4,0]undecene-7, 1,5-diazabicyclo[4,3,0]nonene-5, 1,4-diazabicyclo[2,2,2]octane, and the like.

The organic solvent component of the reaction medium includes amide type solvents such as N,N-dimethylformamide, N,N-dimethylacetamide, N-methyl-2-pyrrolidone, tetramethylurea, hexamethylphosphoramide, and the like, aromatic solvents such as benzene, toluene, xylene, nitrobenzene, benzonitrile, etc., and ether type solvents such as dibutyl ether, tetrahydrofuran, dioxane, di(methoxyethyl) ether, and the like, and dimethyl sulfoxide, pyridine, and the like.

The palladium catalyst employed includes the halides, organic acid salts and inorganic acid salts, and the like of palladium. Specifically preferred are palladium acetate, palladium chloride, palladium bromide, palladium iodide, palladium sulfate, and complexes of the aforementioned palladium compounds with phosphine compounds such as dichloro-bis(triphenylphosphine) palladium, dibromo-bis(triphenylphosphine) palladium, diiodo-bis(triphenylphosphine) palladium, dichloro-bis(tritolylphosphine) palladium, dibromo-bis(tritolylphosphine) palladium, diiodo-bis(tritolylphosphine) palladium, chlorophenyl-bis(triphenylphosphine) palladium, bromophenyl-bis(triphenylphosphine) palladium, tetrakis(triphenylphosphine) palladium, dichloro-bis(benzonitrile) palladium, and the like. The amount of the palladium catalyst employed in the reaction medium ranges from 0.01 to 10%, preferably from 0.1 to 5% relative to the bis-alkenoic amide and the aromatic dihalide. The addition of triphenylphosphine to the reaction mixture prior to heating) often gives a more favorable result.

The amount of the base employed ranges from 2 to 5 equivalent per equivalent of the aromatic dihalide, preferably 2.5 to 3 equivalent.

The reaction temperature is around the range of from 50° to 250° C., preferably from 80° to 200° C.

Having now generally described this invention, a further understanding can be obtained by reference to certain specific examples which are provided herein for purposes of illustration only and are not intended to be limiting unless otherwise specified.

EXAMPLE 1

A 1.055 g (2.5 mmols) amount of N,N'-bis-acryloyl-3,4-diaminodiphenyl ether, 0.770 g (2.5 mmols) of 4,4'-diiododiphenyl ether, 0.0056 g (0.025 mmol) of palladium acetate, 0.030 g (0.1 mmol) of tritolylphosphine, and 0.533 g (6.5 mmols) of sodium acetate were dissolved in 10 ml of N,N-dimethylformamide, and agitated for 4 hours at 100° C. under nitrogen stream. After completion of the reaction, the reaction mixture was poured into 500 ml of methanol to yield the polyamide. It was dried in vacuo to yield 1.185 g (100%).

Reduced viscosity: 0.84 dl/g (at a concentration of 0.5 g/dl in N,N-dimethylacetamide at 30° C.)

The IR spectrum had a characteristic amide absorption at 3300 cm$^{-1}$, carbonyl absorption at 1660 cm$^{-1}$, and carbon-carbon double bonds at 1630 cm$^{-1}$.

EXAMPLE 2

The polyamide prepared in Example 1 was dissolved in N,N-dimethylacetamide, and was flow-casted onto a glass plate to form a film. Approximately half of the area of the film was covered with an aluminum foil, and the whole film was exposed to radiation from a 400-W high pressure mercury lamp about 20 cm apart therefrom for 30 minutes. The aluminum foil was removed and then the whole film was immersed in N,N-dimethylformamide. It was found that the portion having been covered with the aluminum foil was soluble in N,N-dimethylformamide, but the portion not having been covered with the aluminum foil was insoluble therein.

The present invention has made it possible to manufacture a polyamide resin having double bonds in the main chain by a simpler process at a lower cost with a higher yield than conventional processes.

Having now fully described this invention, it will be apparent to one of ordinary skill in the art that many changes and modifications can be made thereto without departing from the spirit or scope of the invention as set forth herein.

What is claimed as new and desired to be secured by Letters Patent of the United States is:

1. A method for manufacturing a polyamide resin having double bonds in its main chain and having repeating units represented by the formula (I):

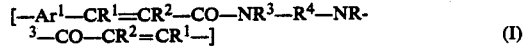

wherein Ar$^1$ is a bivalent aromatic radical, R$^1$, R$^2$ and R$^3$ each independently represent a hydrogen atom, a univalent aromatic or an aliphatic radical, and R$^4$ is a bivalent aromatic or aliphatic radical, said polyamide resin having a reduced viscosity ($\eta sp/c$) of 0.1–5.0 dl/g at a concentration of 0.5 g/dl in N,N-dimethylacetamide at 30° C., comprising reacting a bis-alkenoic amide of formula (II):

wherein R$^1$, R$^2$, R$^3$ and R$^4$ are as defined above with an aromatic dihalide represented by formula (III):

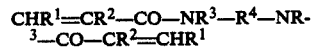

wherein Ar$^1$ is a bivalent aromatic radical and X is a halogen atom, in the presence of a palladium catalyst and a base in an organic solvent.

2. The method according to claim 1, wherein the palladium catalyst is present in an amount ranging from 0.01 to 10% relative to the bis-alkenoic amide and the aromatic dihalide.

3. The method according to claim 1, wherein the reaction is performed at a temperature ranging from 50 to 250° C.

4. The method according to claim 1, wherein the aromatic dihalide is selected from the group consisting of m-dibromobenzene, p-dibromobenzene, 3,3'-dibromo-diphenylmethane, 3,4'-dibromodiphenylmethane, 4,4'-dibromodiphenylmethane, 3,4'-dibromodiphenyl ether, 4,4'-dibromodiphenyl ether, 2,5-dibromothiophene, and 2,5-bis(4-bromophenyl)-3,4-diphenylthiophene.

5. The method according to claim 1, wherein the organic solvent is an aprotic solvent selected from the group consisting of N,N-dimethylformamide, N,N-dimethylacetamide, dimethyl sulfoxide, and pyridine.

6. The method according to claim 1, wherein the palladium catalyst is selected from the group consisting of palladium acetate, palladium chloride, dichloro-bis(triphenylphosphine) palladium, tetrakis(triphenylphosphine) palladium, and dichlorobis(benzonitrile) palladium.

7. The method according to claim 1, wherein said base is selected from the group consisting of 1,4-diazabicyclo[2,2,2]octane, 4-dimethylaminopyridine, and 1,8-diazabicyclo[5,4,0]undecene-7.

8. The method according to claim 1, where said base is present in an amount ranging from 2 to 5 equivalents per equivalent of the aromatic dihalide.

9. The method according to claim 1, wherein R$^1$ and R$^2$ and/or R$^1$ and R$^3$ are linked together to form a ring structure.

* * * * *